United States Patent [19]

Koifman et al.

[11] Patent Number: 5,760,648
[45] Date of Patent: Jun. 2, 1998

[54] ELECTRONIC CIRCUIT FOR CONVERTING A DIFFERENTIAL SIGNAL INTO A SINGLE-ENDED SIGNAL WITH COMMON MODE VOLTAGE REJECTION BY RESISTOR NETWORK

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 689,614

[22] Filed: Aug. 12, 1996

[51] Int. Cl.$^6$ ........................................ H03F 3/45
[52] U.S. Cl. .................. 330/258; 330/69; 327/561; 327/361
[58] Field of Search .............. 330/258, 69; 327/563, 327/561, 560, 361

[56] References Cited

U.S. PATENT DOCUMENTS

| | | | |
|---|---|---|---|
| 3,761,831 | 9/1973 | Foerster | 330/258 |
| 4,037,170 | 7/1977 | Richards | 330/69 |
| 4,206,416 | 6/1980 | Kellogg | 330/69 |
| 4,525,677 | 6/1985 | Rorden | 330/258 |
| 4,782,305 | 11/1988 | Westwick et al. | 330/294 |
| 5,300,896 | 4/1994 | Suesserman | 330/69 |
| 5,424,677 | 6/1995 | Carson | 330/258 |
| 5,481,225 | 1/1996 | Lumsden et al. | 330/254 |

FOREIGN PATENT DOCUMENTS

| | | | |
|---|---|---|---|
| 0244973 | 11/1987 | European Pat. Off. | H03F 3/45 |
| 0525656 | 2/1993 | European Pat. Off. | H03F 3/45 |

*Primary Examiner*—Timothy P. Callahan
*Assistant Examiner*—Terry L. Englund
*Attorney, Agent, or Firm*—Robert M. Handy

[57] ABSTRACT

A differential-to-single-ended converter comprising a resistor network (205) and an operational amplifier is introduced. In comparison to prior art converters, a resistor (250) placed between the non-inverting input (264) of the operational amplifier (260) and the negative input terminal (202) of the converter (200). The common mode voltage ($V_{nii}'$) at the non-inverting input (264) does not depend on the differential input voltage ($V_{in}^*$) of the converter (200) and has low fluctuations. This allows the use of an operational amplifier (260) with low CMRR and makes the converter (200) suitable for low voltage applications.

10 Claims, 2 Drawing Sheets

100

5,760,648

ELECTRONIC CIRCUIT FOR CONVERTING A DIFFERENTIAL SIGNAL INTO A SINGLE-ENDED SIGNAL WITH COMMON MODE VOLTAGE REJECTION BY RESISTOR NETWORK

FIELD OF THE INVENTION

This invention relates to semiconductor electronic devices, especially to differential-to-single-ended converters.

BACKGROUND OF THE INVENTION

Analog portions of mixed integrated circuits are often fully differential but have a single-ended output. A differential-to-single-ended converter, hereinafter 'converter' is an electronic circuit transforming a double path input signal into a single-ended output signal.

FIG. 1 is a simplified circuit diagram of converter 100 as known in prior art.

Converter 100 comprises resistors $R_1$, $R_2$, $R_3$, $R_4$ (110, 120, 130, 140) and operational amplifier 160.

Resistor $R_1$ (110) is coupled between negative input terminal 102 and inverting input 162 of operational amplifier 160. Resistor $R_2$ (120) is coupled between inverting input 162 and output 166 of operational amplifier 160. Output 166 is coupled to output terminal 106 of converter 100. Resistor $R_3$ (130) is coupled between positive input terminal 104 and non-inverting input 164. Resistor $R_4$ (140) is coupled between non-inverting input 164 and reference terminal 109 (e.g., ground).

Signals and their symbols are introduced for further explanations. Unless otherwise specified, all voltages are referred to a reference terminal 109 (e.g., ground). Converter 100 receives input voltages $V_p$ and $V_n$ at input terminals 104, 102 and supplies output voltage $V_{out}$ to output terminal 106.

Input voltages $V_p$ and $V_n$ have a common mode component $V_{pn}'$ and differential mode components $V_p^\#$, $V_n^\#$. They are related as $V_p = V_{pn}' + V_p^\#$ and $V_n = V_{pn}' + V_n^\#$. $V_{in}^\#$ is the differential input voltage $V_{in}^\# = V_p - V_n = V_p^\# - V_n^\#$.

Output voltage $V_{out} = V_{out}' + V_{out}^\#$ has a DC component $V_{out}'$ and an AC component $V_{out}^\#$.

At operational amplifier 160, $V_{ni}$ and $V_i$ are the voltages at non-inverting input 164 and inverting input 162, respectively. $V_{ni}$ and $V_i$ have common and differential mode components: $V_{ni} = V_{nii}' + V_n^\#$ and $V_i = V_{nii}' + V_i^\#$.

In converter 100, input voltages $V_p$, $V_n$ are transferred into output voltage $V_{out}$. The information signal exists only in the differential or AC voltages ($V_p^\#$, $V_n^\#$, $V_{in}^\#$, $V_{out}^\#$), whereas common mode or DC voltages ($V_{pn}'$, $V_{nii}'$, $V_{out}'$) contribute to unwanted effects such as for example noise or bandwidth limitation.

Converter 100 has differential gain $A^\# = V_{out}^\#/V_{in}^\#$ which is desired to be linear. Converter 100 also has a common mode rejection ratio CMRR $= V_{pn}'/V_{out}'$ (also CMRR $= \Delta V_{pn}'/\Delta V_{out}'$) which should be maximized.

If the resistors are in the relation $R_1/R_2 = R_3/R_4$, the common mode voltage $V_{nii}'$ at non-inverting input 164 does not affect the DC output voltage $V_{out}'$. In this case, a change $\Delta V_{nii}'$ would also have no influence on $V_{out}'$. However, the common mode voltage $V_{nii}'$ is related to the differential mode input voltage $V_{in}^\#$. The common mode voltage $V_{nii}'$ at operational amplifier 160 changes even if the common mode input voltage $V_{pn}'$ at input terminals 104, 102 is constant.

Operational amplifier 160 itself can reject the common mode voltage $V_{nii}'$ and changes $\Delta V_{nii}'$ therein so that the DC output voltage $V_{out}'$ remains unchanged. But this feature is limited by the common-mode rejection ratio (CMRR) of operational amplifier 160. The CMRR can depend on changes of $V_{nii}'$. Constructing operational amplifiers 160 having sufficient high CMRR is expensive and not always possible.

The common mode voltage $V_{nii}'$ can be limited by the choice of the resistors $R_1$, $R_2$, $R_3$, $R_4$. However, higher common mode rejection demands higher resistor ratios ($R_1/R_2$) making converter 100 more sensitive to noise.

It is also difficult to provide operational amplifier 160 with high CMRR values at medium and high signal frequencies of e.g. 0.5 MHz and above. At still higher frequencies, common-mode capacities at the input of converter 100 become influential, further degrading performance.

The capability of operational amplifier 160 to accommodate a common mode voltage $V_{nii}'$ in a large range is limited by the supply voltage. That makes it more difficult to use prior art converter 100 in modern low voltage circuits.

The mentioned problems can lead to the consequence that converter 100 must eventually be a stand-alone circuit and can not be integrated into a larger signal processing chip. This is a typical situation for the most popular designs of operational amplifiers 160 and converters 100.

With prior art converter 100, it is also difficult to optimize different factors such as CMRR, resistor values, noise, bandwidth, feedback loop depth and others.

Accordingly, there is an ongoing need to provide a converter which overcomes some or all the deficiencies of the prior art.

BRIEF DESCRIPTION OF THE DRAWINGS

FIG. I is a simplified circuit diagram of a differential-to-single-ended converter according to the prior art.

DETAILED DESCRIPTION OF THE DRAWINGS

Figure 1:
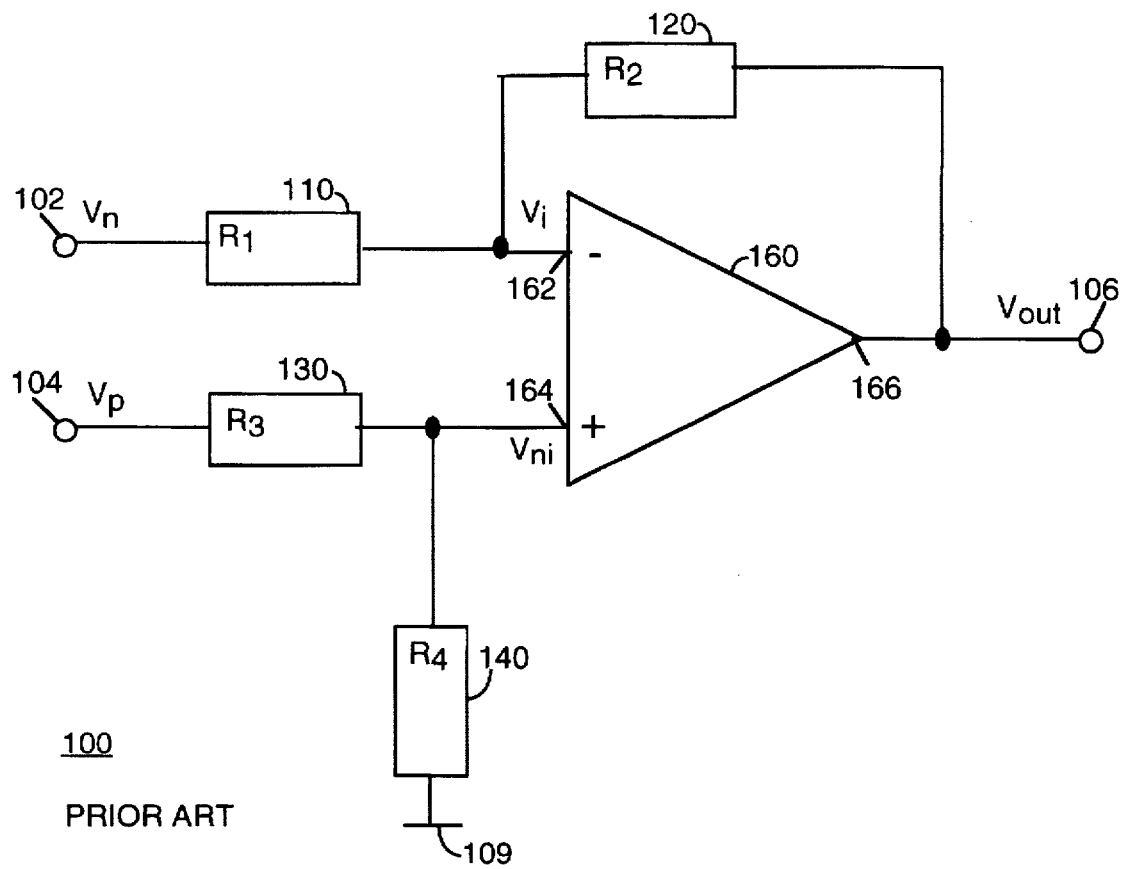
Figure 2:
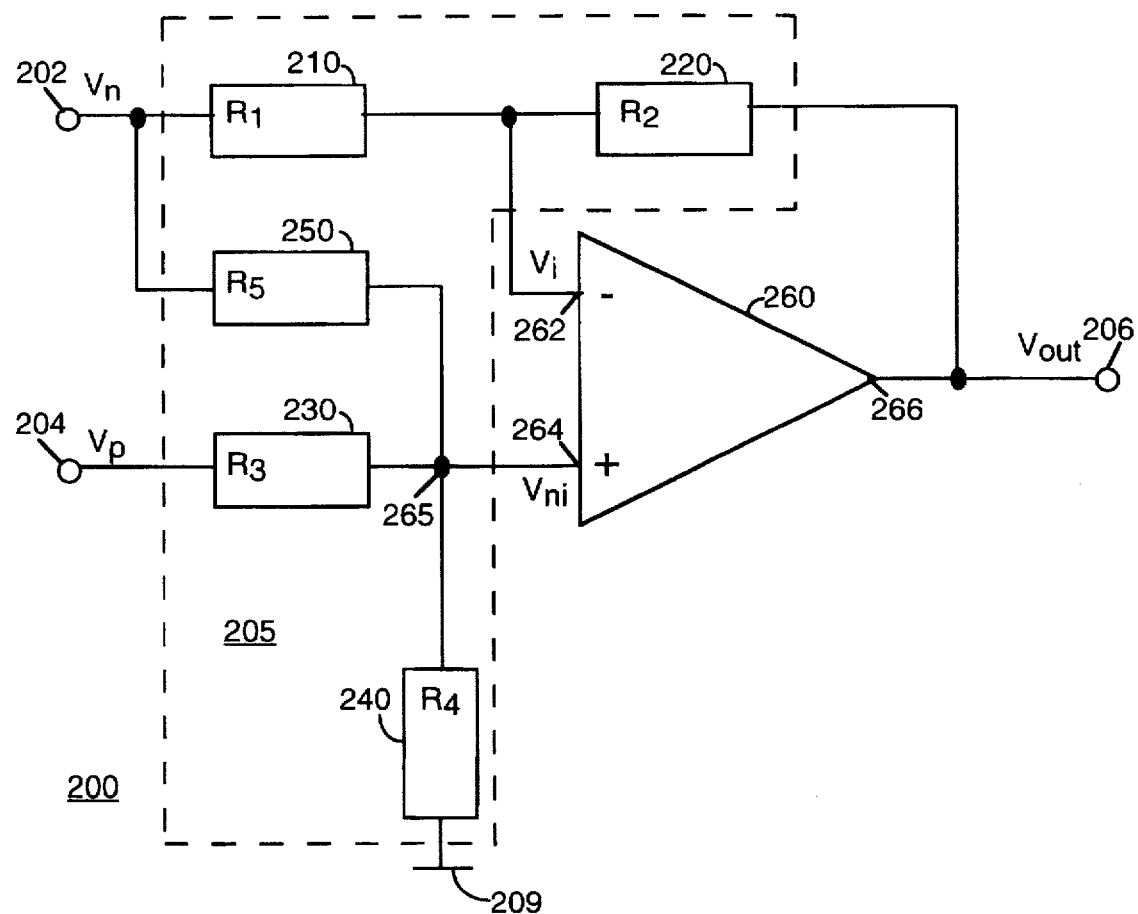
FIG. 2 is a simplified circuit diagram of a differential-to-single-ended converter in a preferred embodiment of the invention.

FIG. 2 is a simplified circuit diagram of electronic circuit 200 according to the present invention. Electronic circuit 200, hereinafter converter 200, converts a differential signal into a single-ended signal. Converter 200 comprises resistor network 205 and operational amplifier 260. Resistor network 205 comprises resistors $R_1$, $R_2$, $R_3$, $R_4$, $R_5$ (210, 220, 230, 240, 250). As used therein, the word 'resistor' is intended to indicate any element exhibiting resistance, inductance, and capacitance.

Resistor $R_1$ (210) is coupled between negative input terminal 202 and inverting input 262 of operational amplifier 260. Resistor $R_2$ (220) is coupled between inverting input 262 and output 266 of operational amplifier 260. Output 266 is coupled to output terminal 206 of converter 200. Resistor $R_3$ (230) is coupled between positive input terminal 204 and at node 265 to non-inverting input 264. Resistor $R_4$ (240) is coupled between node 265 at non-inverting input 264 and reference terminal 209. Resistor $R_5$ (250) is coupled between negative input terminal 202 and node 265 at non-inverting input 264.

The voltages are defined in the same way as for prior art converter 100. Unless otherwise specified, all voltages are referred to reference terminal 209 (e.g., ground).

Converter 200 receives input voltages $V_p$ and $V_n$ at input terminal 204, 202 and supplies output voltage $V_{out}$ to output terminal 206.

Input voltages $V_p$, $V_n$ have a common mode component $V_{pn}'$ and differential mode components $V_p^\#$, $V_n^\#$. They are related as $V_p=V_{pn}'+V_p^\#$ and $V_n=V_{pn}'+V_n^\#$. $V_{in}^\#$ is the differential input voltage $V_{in}^\#=V_p-V_n=V_p^\#-V_n^\#$.

Output voltage $V_{out}$ has a DC component $V_{out}'$ and an AC component $V_{AC}$: $V_{out}=V_{out}'+V_{out}^\#$.

At operational amplifier 260, $V_{ni}$ and $V_i$ are the voltages at non-inverting input 264 and inverting input 262, respectively. $V_{ni}$ and $V_i$ have common and differential mode components: $V_{ni}=V_{nii}'+V_{ni}^\#$ and $Vi=V_{nii}'+V_i^\#$.

In comparison to converter 100 of prior art, converter 200 comprises resistor $R_5$. The values of resistor $R_3$ and resistor $R_5$ are substantially equal.

$V_p$ relates to $V_{ni}$ as:

$$V_{ni}=V_p*R_4/(R_3+R_4) \qquad (1)$$

$V_{ni}$ and $V_n$ relate to $V_{out}$ as:

$$V_{out}-V_{ni}=(V_n-V_{ni})*(-R_2/R_1) \qquad (2)$$

$$V_{out}=V_{ni}*(R_2/R_1+1)-V_n*R_2/R_1 \qquad (3)$$

For the common mode voltage $V_{pn}'$ it can be considered that $R_3$ is parallel coupled to $R_5$. Therefore, the common mode voltage $V_{nii}'$ equals:

$$V_{nii}'=V_{pn}'*R_4/(R_3\#R_5+R_4) \qquad (4)$$

$R_3\#R_5$ is the abbreviation for $R_3*R_5/(R_3+R_5)$.
Equations (3) and (4) are combined and considered for common mode only:

$$V_{out}'=V_{pn}'*[(R_4/(R_3\#R_5+R_4))*(R_2/R_1+1)-R_2/R_1] \qquad (5)$$

The DC voltage $V_{out}'$ at output 266 becomes zero under the condition:

$$R_4/(R_3\#R_5+R_4)*(R_2/R_1+1)=R_2/R_1 \qquad (6)$$

when $R_3=R_5$, the condition (6) can be simplified to:

$$R_1/R_2=R_3/(2*R_4) \qquad (7)$$

The ratio of the value of resistor $R_1$ (210) to the value of resistor $R_2$ (220) substantially equals the ratio of the value of resistor $R_3$ (230) to twice the value of resistor $R_4$ (240). If the condition (7) is satisfied, common mode fluctuations $\Delta V_{pn}'$ of the input voltages $V_p$ and $V_n$ do not affect the output voltage $V_{out}$.

In comparison to prior art, the common mode voltage $V_{nii}'$ at non-inverting input 264 is not related to the differential input voltage $V_{in}^\#$. That means that changes of the input voltage $V_{in}^\#$ ($\Delta V_n^\#=-\Delta V_p^\#$) do not change the common mode component $V_{nii}'$ at non-inverting input 264. If the voltage $V_{nii}'$ is constant then operational amplifier 260 can have a lower common mode impedance than an operational amplifier where $V_{nii}'$ is fluctuating. In other words, an operational amplifier 160 as used in prior art converter 100 must be able to receive a fluctuating voltage $V_{nii}'$. The supply voltage for operational amplifier 160, 260 must be higher than the range of $V_{nii}'$. In converter 200 of the invention, the range of $V_{nii}'$ can substantially be reduced by resistor network 205. Therefore, the supply voltage for operational amplifier 260 can also be reduced. Converter 200 is therefore suitable for low voltage applications.

The voltage $V_{nii}'$ at non-inverting input 264 is held at a constant value. Differential voltages $V_{in}^\#$ are amplified to AC output voltage $V_{out}^\#$. The gain is $A=R_2/R_1$.

It will be appreciated that although only one particular embodiment of the invention has been described in detail, various modifications and improvements can be made by a person skilled in the art based on the teachings herein without departing from the scope of the present invention.

For example, it is possible to replace resistors $R_1$, $R_2$, $R_3$, $R_4$, $R_5$ by complex resistors which have real and imaginary components. Such complex resistors can be, e.g., capacitors, coils, other components or a combination thereof. In that case, converter 200 can have additional functions, such as for example, the function of a filter.

Having thus described the invention it will be apparent that a converter according to the invention comprises an additional resistor $R_5$ coupled between negative input terminal and non-inverting input. The converter of the invention has all properties of the prior art plus additional advantages. For example, the common mode voltage $V_{nii}'$ at the input of the operational amplifier is not related to the differential input voltage $V_{in}^\#$. Further, the requirements to the CMRR of the operational amplifier can be reduced. This allows the cost-efficient use of operational amplifiers with low CMRR and low common mode impedance in circuits where previously expensive operational amplifiers had to be used.

Accordingly, the converter of the invention is especially suitable for low voltage applications.

We claim:

1. An electronic circuit for converting a differential input voltage to a single-ended output voltage having an operational amplifier;

a resistor $R_1$ coupled between a negative input terminal and an inverting input of said operational amplifier;

a resistor $R_2$ coupled between the inverting input and an output of said operational amplifier;

a resistor $R_3$ coupled between a positive input terminal and a non-inverting input of said operational amplifier; and a resistor $R_4$ coupled between the non-inverting input of said operational amplifier and a reference terminal;

characterized in that said electronic circuit further comprises:

a resistor $R_5$ coupled between the negative input terminal and the non-inverting input of said operational amplifier, by-passing said resistor $R_1$ $R_3$.

2. The electronic circuit of claim 1, characterized in that the values of said resistor $R_3$ and said resistor $R_5$ are substantially equal.

3. The electronic circuit of claim 1, characterized in that said resistor $R_1$ has a first value and
   said resistor $R_2$ has a second value and
   said resistor $R_3$ has a third value and
   said resistor $R_4$ has a fourth value, and wherein
       a ratio of said first value to said second value substantially equals
       a ratio of said third value to twice said fourth value.

4. The electronic circuit of claim 1, wherein said resistors $R_1$, $R_2$, $R_3$, $R_4$ are substantially related in value by:

$$R_1/R_2=R_3/(2*R_4).$$

5. The electronic circuit of claim 1, wherein said resistors $R_3$, $R_5$ are substantially related in value by: $R_3=R_5$.

6. The electronic circuit of claim 1, wherein said resistors $R_1$, $R_2$, $R_3$, $R_4$, $R_5$ are complex resistors having real and imaginary components.

7. An electronic circuit comprising:

an operational amplifier having inverting input, non-inverting input and output;

a positive input terminal;

a negative input terminal;

an output terminal coupled to said output of said operational amplifier;

a first resistor coupled between said negative input terminal and the inverting input of said operational amplifier;

a second resistor coupled between the inverting input of said operational amplifier and said output;

a third resistor coupled between said positive input terminal and said non-inverting input of said operational amplifier; and a fourth resistor coupled between the non-inverting input of said operational amplifier and a reference terminal characterized in that said electronic circuit further comprises a fifth resistor coupled between the negative input terminal and the non-inverting input of said operational amplifier by-passing said first and third resistors; and that said third resistor and said fifth resistor have substantially equal values and that said the ratio between the values of said first resistor and said second resistor substantially equal the ratio between said third resistor and doubled a value of said fourth resistor.

8. A resistor network as part of an electronic circuit having an operational amplifier with inverting input, non-inverting input and output, said resistor network comprising:

a positive input terminal coupled by a first resistor to said non-inverting input, a negative input terminal coupled to said inverting input by a second resistor, and an output terminal coupled to said output and coupled by a third resistor to said inverting input, and a fourth resistor coupled between said non-inverting input and a reference terminal, characterized in that said network further comprises a fifth resistor coupled between said negative input terminal and said non-inverting input by-passing the first and second resistors.

9. The resistor network of claim 8 wherein said fifth resistor has substantially the same value as said first resistor.

10. The resistor network of claim 8 wherein the ratio of said second resistor to said third resistor substantially equals the ratio of said first resistor to twice said fourth resistor.

* * * * *